US007026959B2

(12) United States Patent
Orrico et al.

(10) Patent No.: US 7,026,959 B2
(45) Date of Patent: Apr. 11, 2006

(54) OPTICAL JOYSTICK MODULE

(75) Inventors: Mario M. Orrico, Chicago, IL (US); Daniel J. Danek, Berwyn, IL (US)

(73) Assignee: Illinois Tool Works Inc, Glenview, IL (US)

( * ) Notice: Subject to any disclaimer, the term of this patent is extended or adjusted under 35 U.S.C. 154(b) by 588 days.

(21) Appl. No.: 10/302,715

(22) Filed: Nov. 22, 2002

(65) Prior Publication Data

US 2003/0099023 A1 May 29, 2003

Related U.S. Application Data

(60) Provisional application No. 60/333,782, filed on Nov. 28, 2001.

(51) Int. Cl.
*H03K 17/94* (2006.01)

(52) U.S. Cl. ........................ 341/31; 345/161; 250/221; 250/215

(58) Field of Classification Search .................. 341/31; 345/161; 463/38; 250/221, 229, 215; 200/5 R
See application file for complete search history.

(56) References Cited

U.S. PATENT DOCUMENTS

| | | | | | |
|---|---|---|---|---|---|
| 4,607,159 | A | * | 8/1986 | Goodson et al. | 250/221 |
| 4,731,530 | A | * | 3/1988 | Mikan | 250/229 |
| 4,994,669 | A | * | 2/1991 | Stern | 250/229 |
| 5,558,329 | A | * | 9/1996 | Liu | 273/148 B |
| 5,621,207 | A | * | 4/1997 | O'Mara | 250/221 |

* cited by examiner

*Primary Examiner*—Timothy Edwards, Jr.
(74) *Attorney, Agent, or Firm*—Paul F. Donovan; Mark W. Croll

(57) ABSTRACT

A joystick module in which a toggle arm controls movement of a plurality of shutters, with each shutter arranged between a light receiver and a light emitter. Control of the light from the light receiver to the light emitter of each pair provides signal information for controlled operation of an activity.

30 Claims, 6 Drawing Sheets

OPTICAL JOYSTICK MODULE

CROSS REFERENCE TO RELATED APPLICATION

This application claims benefit to U.S. Provisional Application Ser. No. 60/333,782 filed on Nov. 28, 2001.

FIELD OF THE INVENTION

The present invention relates generally to switch mechanisms, and, more particularly to joystick modules for controlling apparatus movement in multiple directions.

BACKGROUND OF THE INVENTION

Material handling equipment, such as lift trucks and the like, employ elevating mechanism for lifting and moving loads. In a common configuration for lift trucks, a pair of forks are slid under a load, and then raised to lift the load.

The load can then be moved and placed in another location, or stacked on other articles.

Since loads are not always piled evenly, surfaces are irregular, and articles themselves can be of different shapes, it is often necessary to tilt the forks forward or backward and from side to side to evenly engage the load, or to disengage from the load. Lift trucks are designed with this capability. Thus, the operator has many individual functions to perform in addition to starting, stopping, speed control and steering. The operator must raise and lower the forks and tilt them forward, backward, left or right. In large warehousing and product transfer facilities, operator efficiency can impact significantly the overall product movement rates. Efficient lift truck operators raise, lower and tilt the forks even as the lift truck is moving. To do so efficiently and safely, controls must be conveniently located, to require minimal arm movement to adjust from one control to another.

It is known to use joystick type switches for movement control of many devices. Known joystick switches are mechanical devices. Advantageously, joystick switches can be used to combine multiple functions in a single control, and if mounted on a handle or grip can be activated by a single finger or thumb.

Thus, a joystick module can be used advantageously in a lift truck control to tilt the forks or perform other control functions.

However, known mechanical joystick modules are inconveniently large, thereby reducing the number of controls for other functions that can be included conveniently in a single grip, for example. Further, warehousing and product handling environments can be extreme. For example, lift trucks are used in refrigerated facilities, and may move continuously and repetitively between warm and cold air areas. Lift trucks often are used outdoors and subjected to weather extremes. Further, lift trucks also are used in dirty, dusty environments.

Mechanical joysticks switches can fail if subjected to such extreme conditions for a prolonged period of time. As a result of the mechanical mechanism therein, known joystick modules which have anticipated lifetimes that are inconveniently short, requiring periodic replacement throughout the life of a fork lift truck.

What is needed is a compact joystick module that can withstand temperature extremes and fluctuations and continue to operate in dirty conditions for a prolonged, extended period of time.

SUMMARY OF THE INVENTION

The present invention provides a joystick module that operates with photoelectric cells, thereby eliminating many of the disadvantages inherent in mechanical joysticks switch designs. .

In one aspect thereof, the present invention provides a joystick module with a plurality of switches each including a light source and a light receiver operatively arranged with each other, the light source adapted to emit light therefrom and the light receiver adapted to transmit a signal therefrom upon reception of light from the light source. A shutter is disposed in each switch, between the light source and the light receiver in the switch. A toggle arm is operatively associated to each shutter, whereby movement of the toggle arm moves a selected shutter to selectively clear and interrupt a light path between the light source and the light receiver on opposite sides of the selected shutter.

In another aspect thereof, the present invention provides a joystick module with an enclosure including a plate and a cover. A toggle arm in the enclosure includes an end accessible through the cover. Individual shutters of a plurality of shutters are operated by the toggle arm. Each switch of a plurality of switches has a light emitter and a light receiver arranged on opposite sides of a shutter.

In still another aspect thereof, the present invention provides an optical joystick control with a plurality of optical switches each including a light emitter and a light receiver. A shutter in each switch is disposed between the emitter and receiver of the switch. A toggle arm is connected to each shutter to selectively move the shutter into and out of a light path between the emitter and receiver. A voltage source connected to the emitters; and signal lines are connected to the receivers.

An advantage of the present invention is providing a joystick module that withstands extreme conditions of heat, cold and contamination.

Another advantage of the present invention is providing a joystick module having few parts subjected to mechanical wear.

A further advantage of the present invention is providing an optical joystick module having automatic centering of the joystick toggle arm for returning the control to a home position.

Still another advantage of the present invention is providing a compact joystick control module.

Other features and advantages of the invention will become apparent to those skilled in the art upon review of the following detailed description, claims and drawings in which like numerals are used to designate like features.

Figure 1:
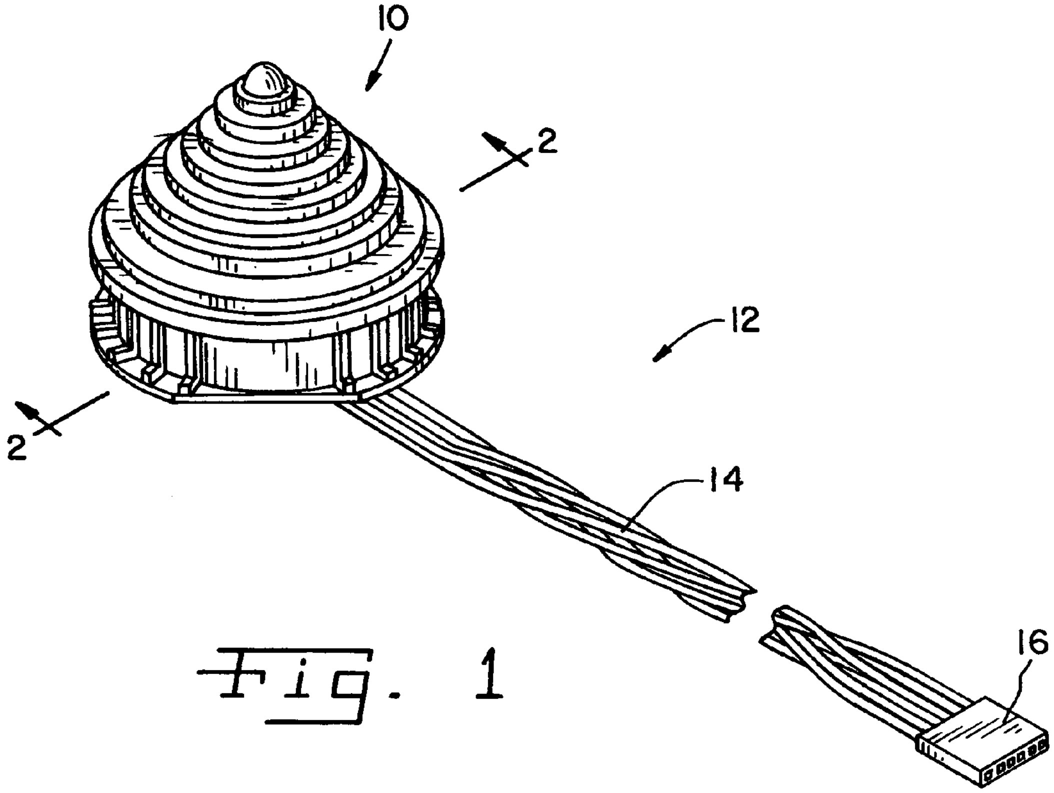
FIG. 1 is a perspective view of a joystick module embodying the present invention.

Before the embodiments of the invention are explained in detail, it is to be understood that the invention is not limited in its application to the details of construction and the arrangements of the components set forth in the following description or illustrated in the drawings. The invention is capable of other embodiments and of being practiced or being carried out in various ways. Also, it is understood that the phraseology and terminology used herein are for the purpose of description and should not be regarded as limiting. The use herein of "including" and "comprising" and variations thereof is meant to encompass the items listed thereafter and equivalents thereof, as well as additional items and equivalents thereof.

DETAILED DESCRIPTION OF THE PREFERRED EMBODIMENT

Referring now more specifically to the drawings and to FIG. 1 in particular, a joystick module 10 in accordance with the present invention is shown. Joystick module 10 is part of a control 12 that further includes a plurality of signal lines 14 and a connector 16. Control 12 can be connected to a controller, signal processor or the like (not shown) for providing user input and control for operation of a device, such as, for example, tilt control of forks on a lift truck. However, those skilled in the art will understand readily that joystick module 10 and control 12 can be used in other applications and for other purposes as well.

Figure 3:
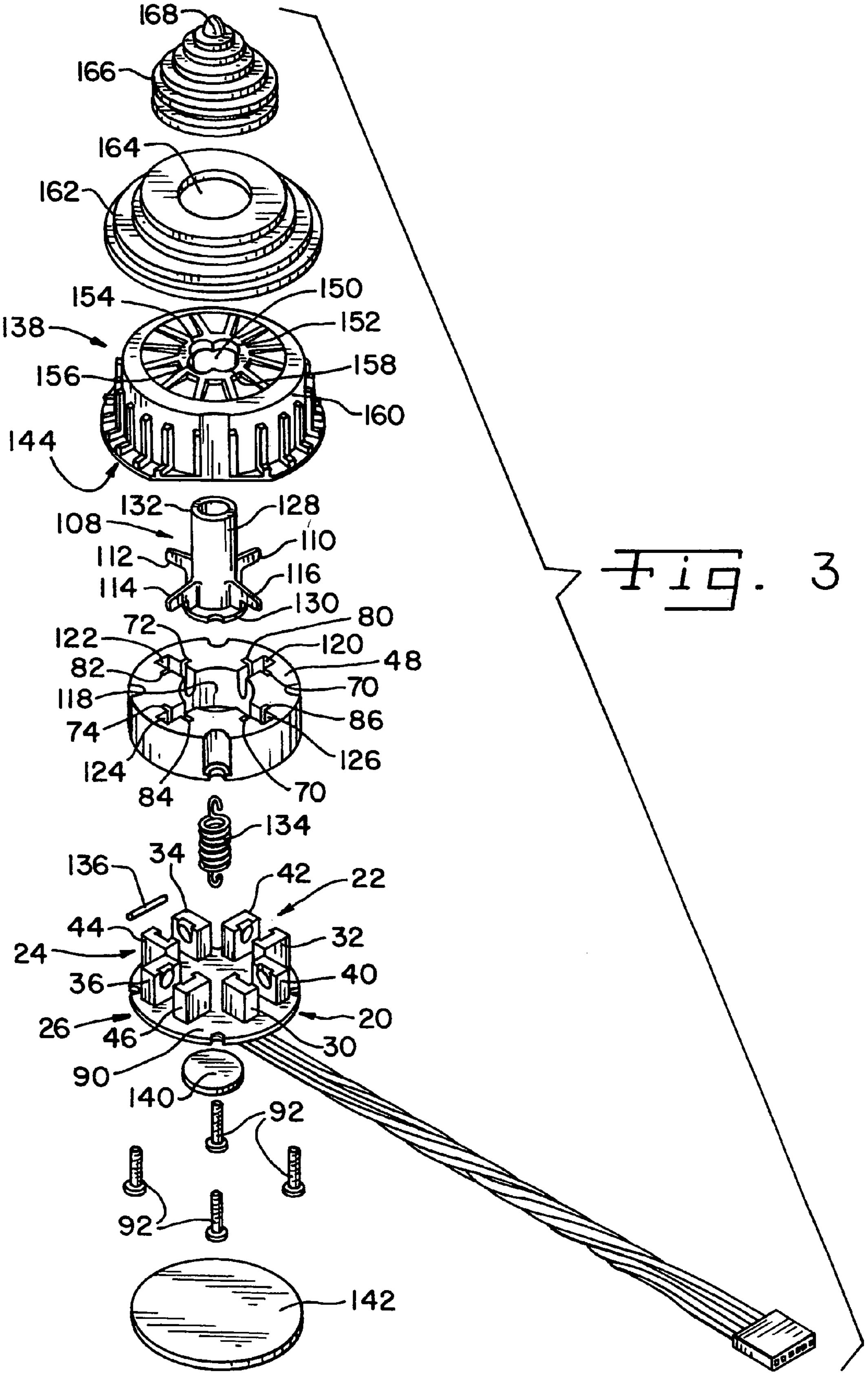
FIG. 3 is an exploded perspective view of the joystick module shown in FIG. 1.
Figure 4:
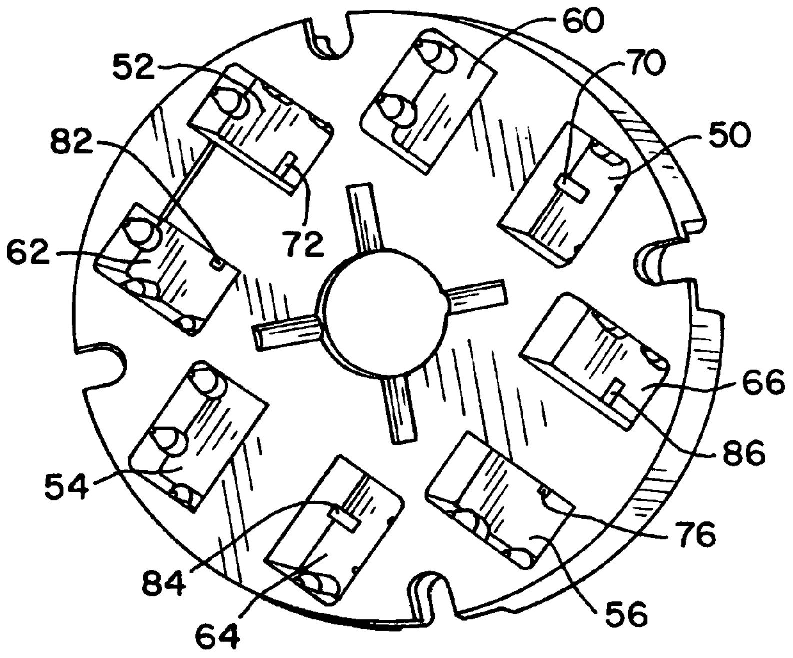
FIG. 4 is a perspective view of one side of a mounting block for the joystick module shown in the previous Figures.
Figure 5:
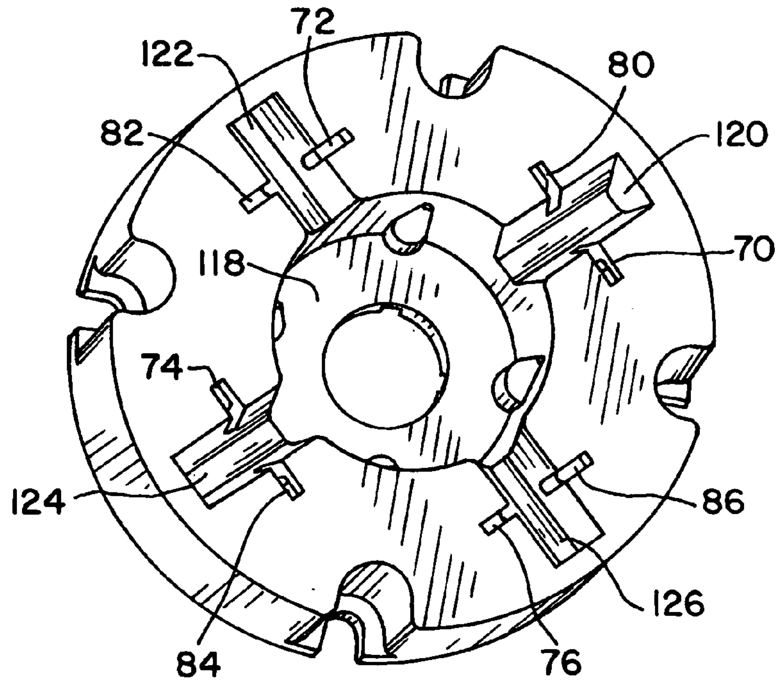
FIG. 5 is a perspective view of the side opposite the side of the mounting block shown in FIG. 4.

With reference now to FIG. 3, an exploded view of joystick module 10 is shown. Module 10 includes a plurality of opto-electronic switches 20, 22, 24 and 26, and as shown includes four opto-electronic switches 20, 22, 24 and 26. Each switch 20, 22, 24 and 26 includes a light source in the way of a light emitter 30, 32, 34 and 36, respectively, and a corresponding light receiver 40, 42, 44 and 46, respectively, operatively arranged in known manner.

Advantageously, light emitters 30, 32, 34 and 36 are of an infrared LED type, to emit a continuous beam of infrared light. Other types of emitters can be used; however, infrared light has advantages over visible light in applications for dirty environments, such as the dusty conditions often present for the use of lift trucks. A Motorola infrared LED model number MLED71 is suitable. Other commercially available devices are also suitable, such as a Fairchild LED.

Receivers 40, 42, 44 and 46 are devices that are actuated by light from emitters 30, 32, 34 and 36. So-called Schmitt Trigger devices are suitable for receivers 40, 42, 44 and 46; however other photo-transistor devices can also be used. In addition, other devices such as Hall effect switches can be used. A Motorola photo detector model number MRD701 is suitable.

Each light emitter 30, 32, 34 and 36 is paired with a light receiver 40, 42, 44 and 46 so that light from the emitter hits the receiver to activate the receiver and issue a signal therefrom in known manner. To retain each emitter 30, 32, 34 and 36 properly aligned with and spaced from its associated receiver 40, 42, 44 or 46, a mounting block 48 is provided with emitter pockets 50, 52, 54 and 56 for receiving and holding therein emitters 30, 32, 34 and 36; and receiver pockets 60, 62, 64 and 66 for receiving and holding therein receivers 40, 42, 44 and 46, respectively. Emitter apertures 70, 72, 74 and 76 are provided in each emitter pocket 50, 52, 54 and 56, respectively, by which light beams from emitters 30, 32, 34 and 36 can be shaped and directed toward receivers 40, 42, 44 and 46, respectively. Similarly, receiver apertures 80, 82, 84 and 86 are provided in receiver pockets 60, 62, 64 and 66, respectively, to limit light reaching receivers 40, 42, 44 and 46 to substantially only that light coming from emitter apertures 70, 72, 74 and 76, respectively.

Emitters 30, 32, 34 and 36 and receivers 40, 42, 44 and 46 are held in emitter pockets 50, 52, 54 and 56 and receiver pockets 60, 62 64 and 66 by a plate 90 secured by a plurality of fasteners 92 such as screws or bolts.

Advantageously, plate 90 can be a printed circuit board on which emitters 30, 32, 34 and 36 and receivers 40, 42, 44 and 46 are installed and electrically connected to other circuit components for the operation thereof.

Figure 8:
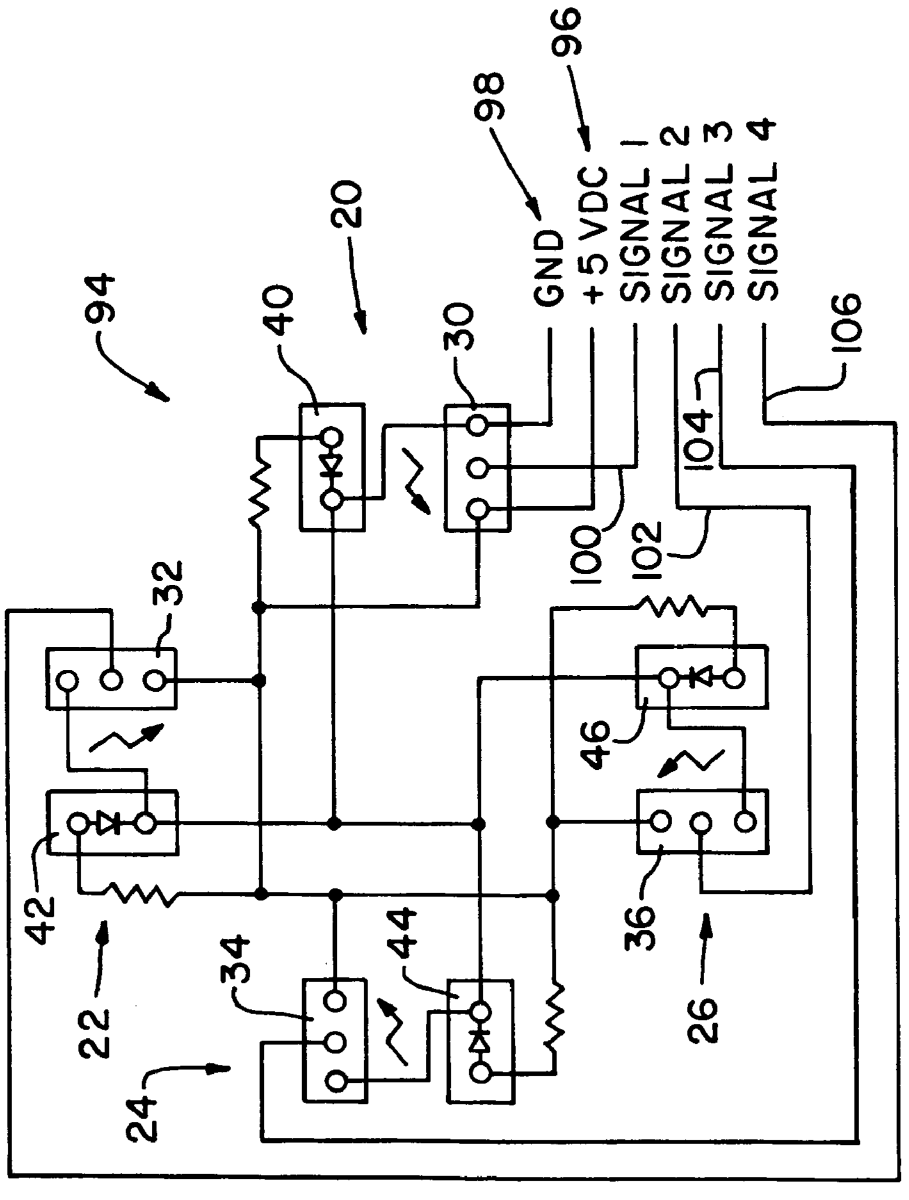
FIG. 8 is a schematic wiring diagram of the joystick module in accordance with the present invention.

Wiring schematic 94 is illustrated in FIG. 8 by which a voltage source 96 is shown connected to emitters 30, 32, 34 and 36, and a ground connection 98 to receivers 40, 42, 44 and 46. As known to those skilled in the art, first, second, third and fourth signal lines 100, 102, 104 and 106, respectively, are provided from receivers 40, 42, 44 and 46, respectively, when each is exposed to light from emitters 30, 32, 34 or 36. The presence or absence of signals on lines 100, 102. 104 or 106 or, more accurately the commencement or interruption of a signals on lines 100, 102, 104 or 106 can be used in a controller to alter a performance controlled by the controller.

A toggle body 108 includes shutters 110, 112, 114 and 116, with one such shutter 110, 112, 114 and 116 positioned within each switch 20, 22, 24 and 26, respectively, between the associated emitters 30, 32, 34 and 36 and receivers 40, 42, 44 and 46 thereof. Toggle body 108 is disposed in a well 118 of mounting block 48, with each shutter 110, 112, 114 and 116 positioned in a slot 120, 122, 124 and 126, respectively, radiating outwardly from well 118 in mounting block 48. As thus positioned, each shutter 110, 112, 114 and 116 can interrupt a direct line of sight between one of emitter apertures 70, 72, 74 and 76 and its associated receiver aperture 80, 82, 84 and 86, respectively.

Toggle body 108 includes a toggle arm 128 projecting at right angles to shutters 110, 112, 114 and 116, and a toggle base 130 disposed in well 118.

Toggle arm 128 extends outwardly of well 118 and includes a distal end 132 by which toggle body 108 can be caused to rock relative to mounting block 48.

Lateral force at distal end 132 causes toggle arm 128 to tilt relative to mounting block 48, with corresponding movement of shutters 110, 112, 114 and 116 in slots 120, 122, 124 and 126 resulting.

Figure 2:
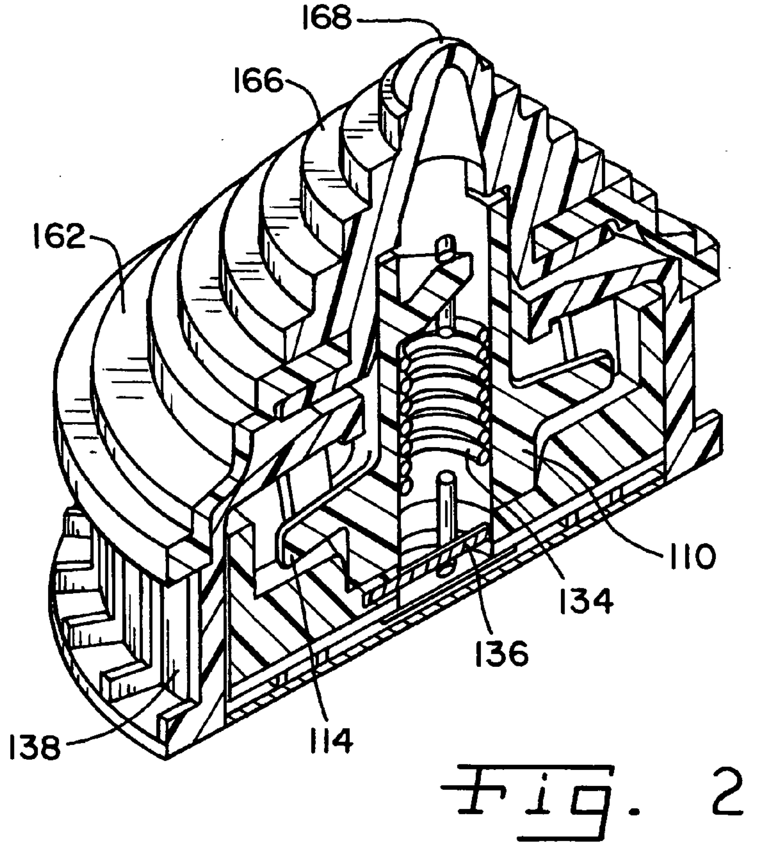
FIG. 2 is an enlarged perspective cross sectional view of the joystick module shown in FIG. 1, taken along line 22 of FIG. 1.

Toggle body 108 is hollow, and an extension spring 134 is disposed therein. Spring 134 is connected at one end thereof to distal end 132 and at another end thereof by a pin 136 to mounting block 48. Pin 136 can be of stainless steel, plastic, music wire, or the like. The manner by which spring 134 is connected to distal end 132 and mounting block 48 is best seen in FIG. 2. Extension spring 134 provides automatic return of toggle arm 128 to its "neutral" position, and a snap or detent feel when toggle arm 128 is moved laterally.

A cover 138 encloses mounting block 48 and plate 90. Cover 138 can be made of plastic or other material suitable for the application, to provide an environmental tight enclosure. Fasteners 92 extend through mounting block 48, and are anchored in cover 138. A spring cover 140 of material such as acetyl or polyester is provided on plate 90, and potting resin material 142, which may be an epoxy such as Devcon HP250, fills open end 144 of cover 138.

Toggle arm 128 projects through a hole 150 in cover 138. The perimeter of hole 150 defines lobes 152, 154, 156 and 158 for guiding and directing the lateral movement of toggle arm 128. Cover 138 is positioned relative to mounting block 48 such that only a single switch 20, 22, 24 or 26 is actuated at a time, as will be explained more fully hereinafter.

Cover 138 defines an outer rim 160 for engaging a boot 162. Boot 162 has an opening 164 therein through which toggle arm 128 projects. Boot 162 is of cascading configuration and is made of silicone rubber. A cap 166 of similar material has a nipple 168 that receives distal end 132 of toggle arm 128. Cap 166 is stretched over at least a potion of boot 162, and is sealed thereto, so that the combination of cap 166 and boot 162 provides an environmentally isolating seal for hole 150 of cover 138. Sealing material in the nature of an adhesive or the like can be used to seal boot 162 to cover 138 and cap 166 to boot 162. Alternative, boot 162 and cap 166 can be formed as a single piece. Boot 162 and cap 166, either as separate pieces or as a single piece, are sufficiently flexible and elastic to accommodate lateral movement of toggle arm 128.

In the embodiment illustrated in FIGS. 1–5, current is supplied to each light emitter 30, 32, 34 and 36. With toggle arm 128 in a centered or neutral position, shutters 110, 112, 114 and 116 block the transmission of light from each emitter 30, 32, 34 and 36 to its associated receiver 40, 42, 44 and 46. Receivers 40, 42, 44 and 46 remain in an unexcited state, and no signals are transmitted over signal lines 14.

When an operator desires to initiate an action, force is applied against nipple 168 in the direction designed to commence the desired signal output. The elasticity and flexibility of boot 162 and cap 166 permit the lateral movement of toggle arm 128. As toggle arm 128 is moved, extension spring 134 is stretched. As toggle arm 128 is moved sufficiently to encounter the perimeter of hole 150, the one of lobes 152, 154, 156 or 158 that it encounters guides further movement of toggle arm 128. Shutters 110, 112, 114 and 116 are moved as toggle arm 128 is moved. The positioning of lobes 152, 154, 156 and 158 relative to shutters 110, 112, 114 and 116 causes toggle arm 128 to move only in the plane defined by opposed shutters 110 and 114, or in a plane defined by opposed shutters 112 and 116. If toggle arm 128 is moved within the plane defined by opposed shutters 110 and 114, one of shutters 110 and 114 is caused to move upwardly and the other downwardly with respect to slots 120 and 124, depending on the direction in which toggle arm 128 is moved within the plane. Similarly, if toggle arm 128 is moved within the plane defined by opposed shutters 112 and 116, one of shutters 112 and 116 is caused to move upwardly and the other downwardly with respect to slots 122 and 126, depending on the direction in which toggle arm 128 is moved within the plane.

The shapes of shutters 110, 112, 114 and 116, and the positions thereof within switches 20, 22, 24 and 26 are provided such that, for movement of toggle arm 128 in any one of the four controlled directions, only one shutter 110, 112, 114 or 116 is caused to move sufficiently to enable light from its associated emitter 30, 32, 34 or 36 to reach its associated receiver 40, 42, 44 or 46. Only one signal 100, 102, 104 or 106 is transmitted along signal lines 14, depending upon which of receivers 40, 42, 44 or 46 is exposed to light from emitter 30, 32, 34 or 36. The presence or commencement of signal 100, 102, 104 or 106 can be transmitted to a controller (not shown) to initiate the desired action.

When lateral force on toggle arm 128 is removed, extension spring 134 returns toggle arm 128 to its neutral position, and holds toggle arm 128 in the neutral position.

It should be understood that the shapes and arrangements of shutters 110, 112, 114 and 116 can be such that, in the neutral position of toggle arm 128, light from each emitter 30, 32, 34 and 36 is received by its associated receiver 40, 42, 44 and 46. Signals 110, 102, 104 and 106 are each transmitted along signal lines 14 to the controller (not shown). Upon lateral movement of toggle arm 128, in this variation, one shutter 110, 112, 114 or 116 is caused to move into the path of light in one switch 20, 22, 24 or 26. Interruption of the light path interrupts the transmission of one signal 100, 102, 104 or 106, and the interruption of the signal can be used by the controller (not shown) to initiate the desired action.

In some uses of joystick module 10, in some situations, it may be desirable to activate more than one switch 20, 22, 24 and 26 at a time, to initiate a combined response. For such uses, the shape of hole 150, and the configurations and arrangements of shutters 110, 112, 114 and 116 are selected to allow movement of toggle arm 128 in a direction to move two shutters 110, 112, 114 and 116 at one time each sufficiently to initiate the response.

Figure 6:
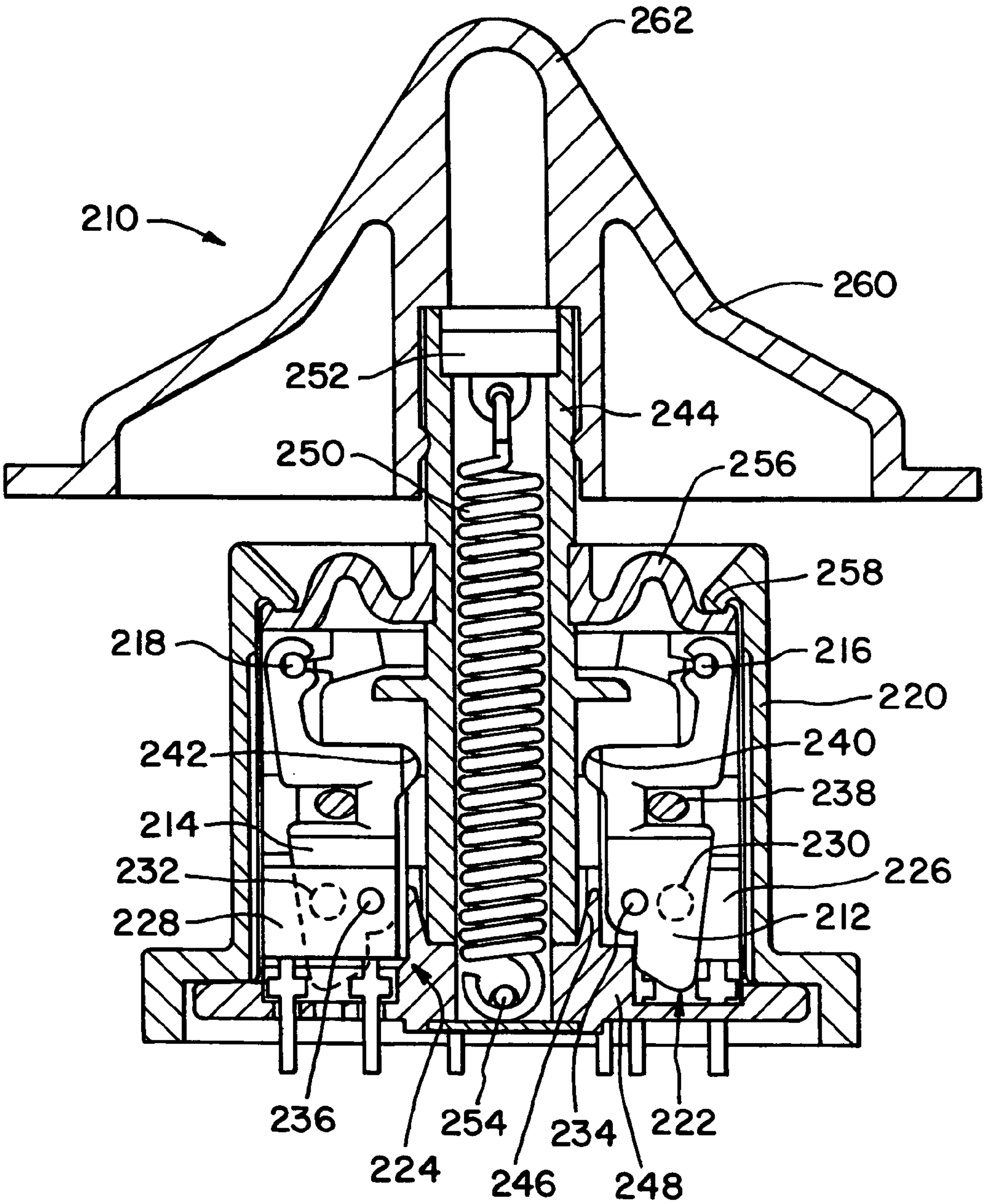
FIG. 6 is an elevational view in cross-section of a second embodiment of a joystick module in accordance with the present invention.

The concepts and principles of the present invention can be incorporated into other structures. In a joystick module second embodiment 210 shown in FIG. 6, elongated shutters 212 and 214 are discrete components having pivotal connections 216 and 218, respectively, to a cover 220 near one end of shutters 212 and 214. While only two shutters 212 and 214 are shown in FIG. 6, it should be understood that two more shutters (not shown) operating in a plane perpendicular to the plane of shutters 212 and 214 also can be used. Alternatively, module 210, as well as module 10, can be provided with more or fewer switches and associated shutters.

As in joystick module 10, shutters 212 and 214 are positioned in optical switches 222 and 224, respectively, to interrupt a direct line of sight between components in switches 222 and 224, one such component 226, 228 being shown in each switch 222, 224, respectively. Dashed circles 230 and 232 illustrate the locations of light beams in switches 222 and 224, respectively. Each shutter 212, 214 is provided with a window 234, 236, respectively, near ends thereof opposite pivotal connections 216 and 218. Windows 234 and 236 can be simple apertures through shutters 212 and 214, or can include clear inserts of plastic or the like through which light can pass. An elastic band 238 or other resilient member or members biases shutters 212 and 214 inwardly so that in a "neutral" position, light beams in switches 222 and 224 are blocked by shutters 212 and 214. Hips 240 and 242 are provided on shutters 212 and 214, respectively, along inner edges thereof.

A toggle arm 244 is provided between shutters 212 and 214, extending outwardly from a well 246 in a base 248. Well 246 angles outwardly from its bottom, allowing toggle arm 244 to rock or tilt therein. A spring 250 is secured at one end to a plug 252 at the outer end of toggle arm 244, and at its opposite end to a pin 254 in base 248. Spring 250 functions similarly to spring 134 of module 10. An annular boot 256 engages a lip 258 of cover 220 and toggle arm 244. A cap 260 fits over the outer end of toggle arm 244 and includes a projection 262 against which lateral force can be applied to tilt toggle arm 244. Hips 240 and 242 are held near toggle arm 244 by the effect of elastic band 238.

To operate joystick module second embodiment 210, lateral force is applied to projection 262 to tilt toggle arm 244, by rocking in well 246. As toggle arm 244 is tilted, one of hips 240 and 242 (or of other shutters not shown) is engaged and pushed outwardly. The outward movement of shutter 212 or 214 aligns window 234 or 236 with the path for the beam of light indicated by dashed circles 230 and 232. Switch 222 or 224 is activated to commence signal transmission to initiate the action required and designated. When lateral force on projection 262 is withdrawn, spring 250 returns toggle arm 244 to its neutral position, and elastic band 238 retracts shutters 212 and 214 to the position shown in FIG. 6. Signal transmission from any switch 222, 224 is interrupted, and the control activity is halted. Alternatively, shutters 212 and 214 can be arranged such that light beams in switches 222 and 224 are not blocked in the neutral position of toggle arm 244, and become blocked only upon the tilting of toggle arm 244. The controlled activity is then initiated by the interruption of a signal from switch 222 or 224 (or other switch not shown), and is stopped when signal transmission is again commenced.

Figure 7:
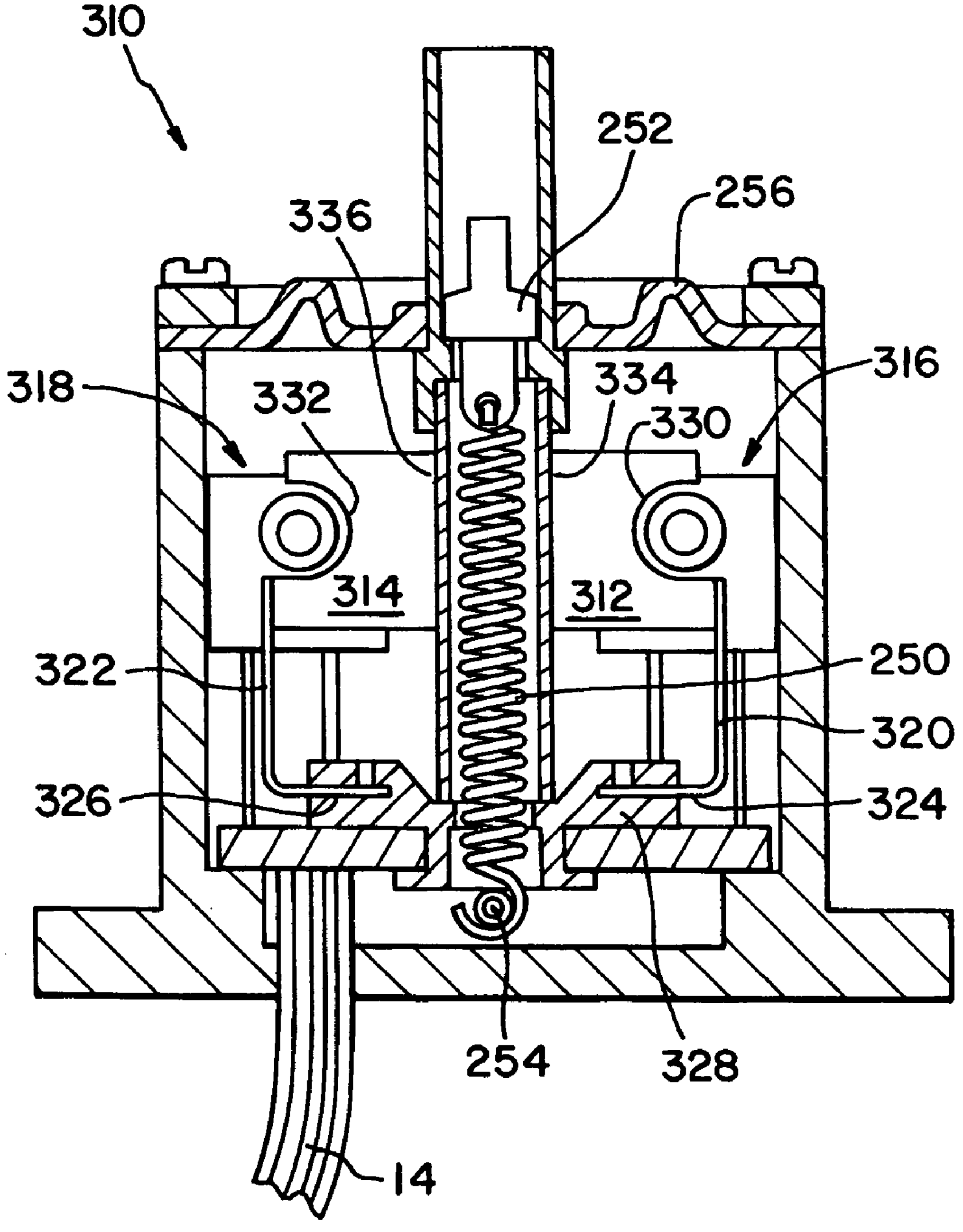
FIG. 7 is an elevational view in cross-section of yet another embodiment of a joystick module in accordance with the present invention.

FIG. 7 illustrates a joystick module third embodiment 310 in accordance with the present invention, which is similar in construction to second embodiment 210, but including some modifications. Shutters 312 and 314 are shown in switches 316 and 318, but more switches and shutters can be used. Shutters 312 and 314 include respective legs 320 and 322, each having a foot 324 or 326. At least legs 320 and 322 are made of springy material, such as spring steel, and, preferably, legs 320 and s22 and feet 324 and 326 are made of such springy material. Shutters 312 and 314, including legs 320 and 322 and feet 324 and 326 can be made of a single, springy material.

Feet 324 and 326 are held in a base 328. Shutters 312 and 314 include cutouts 330 and 332, respectively, so that in a neutral position, light beams in switches 316 and 318 are uninterrupted. Inner edges 334 and 336 of shutters 312 and 314 are held near toggle arm 244. Lateral movement or tilting of toggle arm 244 moves one of shutters 312 or 314 (or another shutter not shown) to a position to interrupt a path of light in one of switches 316 and 318 (or other switch not shown). When lateral force is withdrawn, spring 250 returns toggle arm 244 to a neutral position, and springy legs 320 and 322 return and hold shutters 312 and 314 as illustrated in FIG. 7. Alternatively, shutters 312 and 314 can be provided with windows 234 and 236, positioned so that light beams in switches 316 and 318 are blocked in the neutral position. Again, the commencement or interruption of signals from switches 316 and 318 are used to initiate or terminate the action controlled by module 310

Those skilled in the art will understand readily that still further modifications are possible to the basic concepts of an optical joystick module in accordance with the principles of the present invention. For example, a joystick module can include a combination of switches having light paths blocked and unblocked by shutters when the toggle arm is in the neutral position.

The present invention provides a joystick module that is compact, robust and reliable in extreme conditions of weather and dirt.

Variations and modifications of the foregoing are within the scope of the present invention. It is understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention, and will enable others skilled in the art to utilize the invention. The claims are to be construed to include alternative embodiments to the extent permitted by the prior art.

Various features of the invention are set forth in the following claims.

What is claimed is:

1. A joystick module comprising;

a plurality of at least four switches each including a light source and a light receiver operatively arranged with each other, said light source adapted to emit light therefrom and said light receiver adapted to transmit a signal therefrom upon reception of light from said light source;

a plurality of at least four shutters, with a shutter of said plurality of shutters disposed in each said switch, between said light source and said light receiver in said switch; and a single toggle arm operatively associated with all said shutters whereby movement of said toggle arm moves a selected said shutter to selectively clear and interrupt a light path between said light source and said light receiver on opposite sides of said selected shutter.

2. The joystick module of claim 1, at least some of said shutters having windows therein though which a light beam can pass from said light sources to said receivers of said switches associated with said shutters having said windows.

3. The joystick module of claim 1, said light sources being sources of infrared light.

4. The joystick module of claim 1, including a plate beneath said switches, and a spring connected to said toggle arm and to said plate.

5. The joystick module of claim 1, including a cover having an opening, said toggle arm extending through said opening, and said opening including a perimeter defining four lobes for guiding movement of said toggle arm.

6. The joystick module of claim 1, said toggle arm and said shutters formed integrally as a single monolithic body.

7. The joystick module of claim 1, said toggle arm having a neutral position, and said shutters interrupting light paths between said light sources and said light receivers when said toggle arm is in said neutral position.

8. The joystick module of claim 1, said toggle arm having a neutral position, and said shutters positioned to clear light paths between said light sources and said light receivers when said toggle arm is in said neutral position.

9. The joystick module of claim 1, said switches arranged radially outwardly from said toggle arm and spaced equally from each other.

10. The joystick module of claim 9, said light sources being sources of infrared light.

11. The joystick module of claim 1, said shutters being defined by a single monolithic body.

12. The joystick module of claim 11, said monolithic body further defining said toggle arm.

13. The joystick module of claim 1, including a mounting block for holding said light sources and said light receives, said mounting block defining apertures for light paths between said light sources and said receivers.

14. The joystick module of claim 13, said mounting block defining slots between said apertures, and a shutter disposed in each said slot.

15. The joystick module of claim 1, said shutters pivotally connected to said cover, and said toggle arm adapted to push against a selected said shutter, causing pivotal movement of said shutter about said pivotal connection thereof.

16. The joystick module of claim 15 including elastic means biasing said shutters.

17. The joystick module of claim 16, said shutters having windows therein.

18. A joystick module comprising;

an enclosure including a plate and a cover;

a toggle arm in said enclosure, said toggle arm including an end accessible through said cover;

a plurality of at least four shutters operated by said toggle arm; and a plurality of at least four switches, each said switch having a light emitter and a light receiver arranged on opposite sides of a said shutter.

19. The joystick module of claim 18, at least one said shutter including an opening for alignment with a light path between said light emitter and said light receiver arranged on opposite sides of said at least one shutter.

20. The joystick module of claim 18, including a spring connected to said toggle arm and associated with said toggle arm for urging said toggle arm to a neutral position.

21. The joystick module of claim 18, said toggle arm and said shutters being a monolithic structure.

22. The joystick module of claim 18, including amounting block holding said light emitters and said light receivers in spaced relation; said mounting block defining apertures for directing a light beam from said emitters to said receivers.

23. The joystick module of claim 18, said light emitters being emitters of infrared light.

24. The joystick module of claim 18, said toggle arm having a neutral position in which at least one of said shutters is disposed within light paths between said light emitter and said receiver on apposite sides thereof, and a spring connected to said toggle arm and biasing said toggle arm to said neutral position.

25. The joystick module of claim 18, said toggle arm having a neutral position in which at least one of said shutters is positioned to open a light path between said light emitter and said light receiver on opposite sides thereof, and a spring connected to said toggle arm and biasing said toggle arm to said neutral position.

26. The joystick module of claim 18, said shutters having pivotal connections, and said toggle arm adapted to move a selected said shutter about said pivotal connection of said selected shutter.

27. An optical joystick control comprising;

a plurality of at least four optical switches each including a light emitter and a light receiver;

a shutter in each said switch disposed between the emitter and receiver of the switch;

a toggle arm connected to each shutter to selectively move the shutter into and out of a light path between the emitter and receiver;

a voltage source connected to the emitters; and signal lines connected to the receivers.

28. The joystick control of claim 27, said light emitters being infrared light emitters.

29. The joystick control of claim 28, including a printed circuit board, and said emitters and receivers mounted on said printed circuit board.

30. A joystick module comprising;

a plurality of switches each including a light source and a light receiver operatively arranged with each other, said light source adapted to emit light therefrom and said light receiver adapted to transmit a signal therefrom upon reception of light from said light source;

a plurality of shutters, with a shutter of said plurality of shutters disposed in each said switch, between said light source and said light receiver in said switch;

a toggle arm operatively associated to each said shutter whereby movement of said toggle arm moves a selected said shutter to selectively clear and interrupt a light path between said light source and said light receiver on opposite sides of said selected shutter; and a base, and said shutters having legs secured to said base, said legs being of springy material.

* * * * *